US008829967B2

(12) United States Patent   (10) Patent No.: US 8,829,967 B2
Nohra   (45) Date of Patent: Sep. 9, 2014

(54) BODY-CONTACTED PARTIALLY DEPLETED SILICON ON INSULATOR TRANSISTOR

(75) Inventor: George Nohra, High Point, NC (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 265 days.

(21) Appl. No.: 13/535,203

(22) Filed: Jun. 27, 2012

(65) Prior Publication Data

US 2014/0002171 A1   Jan. 2, 2014

(51) Int. Cl.
*H01L 27/12* (2006.01)
*H03K 5/02* (2006.01)

(52) U.S. Cl.
USPC ............. 327/306; 257/348; 257/E27.112

(58) Field of Classification Search
CPC .................................. H01L 27/12; H03K 5/02
USPC ................... 327/306; 257/348, E27.112
See application file for complete search history.

(56) References Cited

U.S. PATENT DOCUMENTS

| 3,551,788 | A | 12/1970 | Summer |
| 3,699,359 | A | 10/1972 | Shelby |
| 4,053,916 | A | 10/1977 | Cricchi et al. |
| 4,316,101 | A | 2/1982 | Minner |
| 4,491,750 | A | 1/1985 | Janutka |
| 5,012,123 | A | 4/1991 | Ayasli et al. |
| 5,146,178 | A | 9/1992 | Nojima et al. |
| 5,313,083 | A | 5/1994 | Schindler |
| 5,416,043 | A | 5/1995 | Burgener et al. |
| 5,492,857 | A | 2/1996 | Reedy et al. |
| 5,548,239 | A | 8/1996 | Kohama |
| 5,553,295 | A | 9/1996 | Pantelakis et al. |
| 5,572,040 | A | 11/1996 | Reedy et al. |
| 5,596,205 | A | 1/1997 | Reedy et al. |
| 5,600,169 | A | 2/1997 | Burgener et al. |
| 5,663,570 | A | 9/1997 | Reedy et al. |
| 5,777,530 | A | 7/1998 | Nakatuka |
| 5,801,577 | A | 9/1998 | Tailliet |
| 5,818,099 | A | 10/1998 | Burghartz |
| 5,861,336 | A | 1/1999 | Reedy et al. |
| 5,863,823 | A | 1/1999 | Burgener |
| 5,883,396 | A | 3/1999 | Reedy et al. |
| 5,895,957 | A | 4/1999 | Reedy et al. |
| 5,920,233 | A | 7/1999 | Denny |

(Continued)

FOREIGN PATENT DOCUMENTS

| CN | 1256521 | 6/2000 |
| EP | 0385641 | 9/1990 |

(Continued)

OTHER PUBLICATIONS

Assaderaghi, et al.; "Dynamic Threshold-Voltage MOSFET (DTMOS) for Ultra-Low Voltage VLSI;" IEEE. vol. 44; No. 3; 414-421; Mar. 1997.

(Continued)

*Primary Examiner* — Timothy Thompson
*Assistant Examiner* — Charles Pizzuto
(74) *Attorney, Agent, or Firm* — Schwabe Williamson & Wyatt

(57) ABSTRACT

Embodiments include an apparatus, system, and method related to a body-contacted partially depleted silicon on insulator (PDSOI) transistor that may be used in a switch circuit. In some embodiments, the switch circuit may include a discharge transistor to provide a discharge path for a body of a switch transistor. Other embodiments may be described and claimed.

20 Claims, 3 Drawing Sheets

(56) References Cited

U.S. PATENT DOCUMENTS

| | | | |
|---|---|---|---|
| 5,930,638 | A | 7/1999 | Reedy et al. |
| 5,945,867 | A | 8/1999 | Uda et al. |
| 5,973,363 | A | 10/1999 | Staab et al. |
| 5,973,382 | A | 10/1999 | Burgener et al. |
| 6,057,555 | A | 5/2000 | Reedy et al. |
| 6,066,993 | A | 5/2000 | Yamamoto et al. |
| 6,160,292 | A | 12/2000 | Flaker et al. |
| 6,173,235 | B1 | 1/2001 | Maeda |
| 6,249,027 | B1 | 6/2001 | Burr |
| 6,308,047 | B1 | 10/2001 | Yamamoto et al. |
| 6,452,232 | B1 | 9/2002 | Adan |
| 6,504,212 | B1 | 1/2003 | Allen et al. |
| 6,563,366 | B1 | 5/2003 | Kohama |
| 6,631,505 | B2 | 10/2003 | Arai |
| 6,632,724 | B2 | 10/2003 | Henley et al. |
| RE38,319 | E | 11/2003 | Lin et al. |
| 6,642,578 | B1 | 11/2003 | Arnold et al. |
| 6,693,326 | B2 | 2/2004 | Adan |
| 6,790,747 | B2 | 9/2004 | Henley et al. |
| 6,804,502 | B2 | 10/2004 | Burgener et al. |
| 6,898,778 | B2 | 5/2005 | Kawanaka |
| 6,908,832 | B2 | 6/2005 | Farrens et al. |
| 6,924,673 | B2 | 8/2005 | Tanishima |
| 6,958,519 | B2 | 10/2005 | Gonzalez et al. |
| 6,969,668 | B1 | 11/2005 | Kang et al. |
| 6,978,437 | B1 | 12/2005 | Rittman et al. |
| 6,989,706 | B2 | 1/2006 | Sekigawa et al. |
| 7,056,808 | B2 | 6/2006 | Henley et al. |
| 7,057,472 | B2 | 6/2006 | Fukamachi et al. |
| 7,058,922 | B2 | 6/2006 | Kawanaka |
| 7,123,898 | B2 | 10/2006 | Burgener et al. |
| 7,138,846 | B2 | 11/2006 | Suwa |
| 7,158,067 | B2 | 1/2007 | Lauritzen et al. |
| 7,404,157 | B2 | 7/2008 | Tanabe |
| 7,460,852 | B2 | 12/2008 | Burgener et al. |
| 7,616,482 | B2 | 11/2009 | Prall |
| 7,796,969 | B2 | 9/2010 | Kelly et al. |
| 7,860,499 | B2 | 12/2010 | Burgener et al. |
| 7,863,691 | B2 | 1/2011 | Wagner, Jr. et al. |
| 7,890,891 | B2 | 2/2011 | Stuber et al. |
| 7,910,993 | B2 | 3/2011 | Brindle et al. |
| 8,129,787 | B2 | 3/2012 | Brindle et al. |
| 8,159,283 | B2 | 4/2012 | Sugiyama |
| 2001/0015461 | A1 | 8/2001 | Ebina |
| 2001/0045602 | A1 | 11/2001 | Maeda et al. |
| 2002/0195623 | A1 | 12/2002 | Horiuchi |
| 2003/0002452 | A1 | 1/2003 | Sahota |
| 2003/0205760 | A1 | 11/2003 | Kawanaka et al. |
| 2004/0080364 | A1 | 4/2004 | Sander et al. |
| 2005/0167751 | A1 | 8/2005 | Nakajima et al. |
| 2007/0023833 | A1 | 2/2007 | Okhonin et al. |
| 2008/0073719 | A1 | 3/2008 | Fazan et al. |
| 2008/0076371 | A1 | 3/2008 | Dribinsky et al. |
| 2008/0303080 | A1 | 12/2008 | Bhattacharyya |
| 2009/0029511 | A1 | 1/2009 | Wu |
| 2011/0227637 | A1 | 9/2011 | Stuber et al. |
| 2012/0169398 | A1 | 7/2012 | Brindle et al. |
| 2012/0267719 | A1 | 10/2012 | Brindle et al. |
| 2014/0009214 | A1 | 1/2014 | Altunkilic |

FOREIGN PATENT DOCUMENTS

| | | |
|---|---|---|
| EP | 1006584 | 6/2000 |
| EP | 1451890 | 2/2011 |
| JP | 5575348 | 6/1980 |
| JP | 01254014 | 10/1989 |
| JP | 02161769 | 6/1990 |
| JP | 04183008 | 6/1992 |
| JP | 06334506 | 12/1994 |
| JP | 08148949 | 6/1996 |
| JP | 08307305 | 11/1996 |
| JP | 09284114 | 10/1997 |
| JP | 10242829 | 9/1998 |
| JP | 11136111 | 5/1999 |
| JP | 2003060451 | 2/2003 |
| JP | 3408762 | 5/2003 |
| JP | 2003189248 | 7/2003 |
| JP | 2004515937 | 5/2004 |
| WO | 9523460 | 8/1995 |
| WO | 0227920 | 4/2002 |
| WO | 2007008934 | 1/2007 |
| WO | 2007035610 | 3/2007 |

OTHER PUBLICATIONS

Bolam, R. et al., "Reliability Issues for Silicon-on-Insulator," Electron Devices Meeting Technical Digest, 2000, pp. 131-134.

Burgener, et al.; "CMOS SOS Switches Offer Useful Features, High Integration;" Microwaves & RF; 107-118; Aug. 2001.

Caverly, R. et al., "A Silicon CMOS Monolithic RF and Microwave Switching Element," 27th European Microwave Conference, Sep. 1997, pp. 1046-1051.

Caverly; "Linear and Nonlinear Characteristics of the Silicon CMOS Monolithic 50-Ω Microwave and RF Control Element;" IEEE. vol. 34; No. 1; 124-126; Jan. 1999.

Celler, et al.; "Smart Cut—A guide to the technology, the process, the products;" http://www.soitec.com/pdf/SmartCut_WP.pdf; Jul. 2003.

Chao, et al.; "High-Voltage and High-Temperature Applications of DTMOS with Reverse Schottky Barrier on Substrate Conctacts;" IEEE Electron Device Letters; vol. 25; No. 2; Feb. 2004; pp. 86-88.

Chung, I. et al., "SOI MOSFET Structure with a Junction-Type Body Contact for Suppression of Pass Gate Leakage," IEEE Transactions on Electron Devices, Jul. 2001, pp. 1360-1365, vol. 48, No. 7.

Dean; "Transistors, Theory and Circuitry." McGraw-Hill Publ. Co. Ltdl; 90-93; 1964.

Drake, et al.; "Dynamic-Threshold Logic for Low-Power VLSI Design." http://www.research.ibm.com/acas/projects/01drake.pdf; 2003.

Edwards, et al.; "The Effect of Body Contact Series Resistance on SOI CMOS Amplifier Stages;" IEEE Transactions on Electron Devices; vol. 44; No. 12; Dec. 1997; pp. 2290-2294.

Hameau, F. et al., "Radio-Frequency Circuits Integration Using CMOS SOI 0.25μm Technology," 2002 RF IC Design Workshop Europe, Mar. 19-22, 2002, 6 pages.

Hess et al.; "Transformerless Capacitive Coupling of Gate Signals for Series Operation of Power MOS Devices;" IEEE; vol. 15; No. 5; Sep. 2000.

Hirano, Y. et al., "Impact of Actively Body-bias Controlled (ABC) SOI SRAM by using Direct Body Contact Technology for Low-Voltage Application," Electron Devices Meeting Technical Digest, 2003, pp. 2.4.1-2.4.4.

Hu, C. et al., "A Unified Gate Oxide Reliability Model," IEEE 37th Annual International Reliability Physics Symposium, 1999, pp. 47-51.

Huang et al.; "A 0.5-μm CMOS T/R Switch for 900-MHz Wireless Applications;" IEEE Journal of Solid-State Circuits; vol. 36; No. 3; Mar. 2001.

Iyama, et al.; "L-Band SPDT Switch Using Si-MOSFET;" The Institute of Electronics, Information and Communication Engineers (IEICE); 636-643; 1996.

Johnson, et al.; "Advanced Thin-Film Silicon-on-Sapphire Technology: Microwave Circuit Applications," IEEE; vol. 45; No. 5; May 1998.

Kuang, J. et al., "A floating-body charge monitoring technique for partially depleted SOI technology," Int. J. Electronics, Nov. 2004, pp. 625-637, vol. 91, No. 11.

Kuang, J. et al., "SRAM Bitline Circuits on PD SOI: Advantages and Concerns," IEEE Journal of Solid-State Circuits, Jun. 1997, pp. 837-844, vol. 32, No. 6.

Kuo, et al.; "Low-Voltage SOI CMOS VLSI Devices and Circuits;" Wiley Interscience, New York, XP001090589, pp. 57-60 and pp. 349-354; 2001.

Lauterbach, et al.; "Charge Sharing Concept and New Clocking Scheme for Power Efficiency and Electromagnetic Emission Improvement of Boosted Charge Pumps;" IEEE Journal of Solid-State Circuits; vol. 35; No. 5; pp. 719-723; May 2000.

(56) References Cited

OTHER PUBLICATIONS

Lee et al., "Effects of Gate Structures on the RF Performance in PD SOI MOSFETs," IEEE Microwave and Wireless Components Letters, Apr. 2005, pp. 223-225, vol. 15, No. 4.

Lee, et al.; "Effect of Body Structure on Analog Performance of SOI NMOSFETs;" Proceedings; 1998 IEEE International SOI Conference; Oct. 5-8, 1998; pp. 61-62.

Lee, H. et al., "Analysis of body bias effect with PD-SOI for analog and RF applications," Solid State Electronics, 2002, pp. 1169-1176, vol. 46.

Lee, H. et al., "Harmonic Distortion due to Narrow Width Effects in Deep sub-micron SOI-CMOS Device for analog-RF applications," 2002 IEEE International SOI Conference, Oct. 2002, pp. 83-85.

Li, et al.; "A 15-GHz Integrated CMOS Switch with 21.5-dBm IP1dB and 1.8-dB Insertion Loss;" IEEE; 2004 Symposium on VLSI Circuits; Digest of Technical Papers; Jun. 17-19, 2004.

Maeda, et al.; "Substrate-Bias Effect and Source-Drain Breakdown Characteristics in Body-Tied Short-Channel SOI MOSFET's;" IEEE Transactions on Electron Devices; vol. 46; No. 1; Jan. 1999; pp. 151-158.

Makioka, S. et al., "Super Self-Aligned GaAs RF Switch IC with 0.25 dB Extremely Low Insertion Loss for Mobile Communication Systems," IEEE Transactions on Electron Devices, Aug. 2001, pp. 1510-1514, vol. 48, No. 8.

Megahed, M. et al, "Low Cost UTSI Technology for RF Wireless Applications," IEEE MTT-S Digest, 1998, pp. 981-984.

Orndorff, et al.; "CMOS/SOS/LSI Switching Regulator Control Device;" Solid-State Circuits Conf.; Digest of Technical Papers; IEEE International; vol. XXI; pp. 234-235; Feb. 1978.

Phillips Semiconductors; "Single Pole Double Throw (SPDT) Switch, RF Communication Products;" IC17 Handbook; 1997.

Rodgers, P. et al., "Silicon UTSi CMOS RFIC for CDMA Wireless Communications Systems," IEEE MTT-S Digest, 1999, pp. 485-488.

Rozeau, O. et al., "SOI Technologies for Low-Power Low-Voltage Radio-Frequency Applications," Analog Integrated Circuits and Signal Processing, 2000, pp. 93-114, vol. 25.

Sedra, A. et al., Microelectronic Circuits, 1998, Fourth Edition, University of Toronto Press, Oxford University Press, pp. 374-375.

Sleight, J. et al., "Transient Measurements of SOI Body Contact Effectiveness," IEEE Electron Device Letters, Dec. 1998, pp. 499-501, vol. 19, No. 12.

Suehle et al., "Low Electric Field Breakdown of Thin SiO2 Films Under Static and Dynamic Stress," IEEE Transactions on Electron Devices, May 1997, pp. 801-808, vol. 44, No. 5.

Tinella, et al.; "A High-Performance CMOS-SOI Antenna Switch for the 2.5 5-GHz Band;" IEEE Journal of Solid-State Circuits; vol. 38; No. 7; Jul. 2003.

Wei, et al.; "Measurement of Transient Effects in SOI DRAM/SRAM Access Transistors;" IEEE Electron Device Letters; vol. 17; No. 5; May 1996.

Workman, et al.; "A Comparative Analysis of the Dynamic Behavior of BTG/SOI MOSFET's and Circuits with Distributed Body Resistance;" IEEE Transactions on Electron Devices; vol. 45; No. 10; Oct. 1998; pp. 2138-2145.

Yamamoto, et al.; A 2.2-V Operation, 2.4-GHz Single-Chip GaAs MMIC Transceiver for Wireless Applications; IEEE; vol. 34; No. 4; Apr. 1999.

Final Office Action in U.S. Appl. No. 13/742,086, dated Mar. 4, 2014.

Office Action, issued in U.S. Appl. No. 13/587,590, dated Sep. 9, 2013, 12 pages.

Notice of Allowance in U.S. Appl. No. 13/587,590 dated Jan. 7, 2014.

Office Action, issued in U.S. Appl. No. 13/742,086, dated Sep. 20, 2013, 9 pages.

BODY-CONTACTED PARTIALLY DEPLETED SILICON ON INSULATOR TRANSISTOR

FIELD

Embodiments of the present disclosure relate generally to the field of circuits, and more particularly to body-contacted partially depleted silicon on insulator transistor.

BACKGROUND

Partially depleted silicon-on-insulator (PDSOI) transistors are a top choice for low-power radio frequency (RF) switch devices, especially in mobile applications where price, performance, and power consumption are key elements. However, PDSOI transistors are challenged when handling larger signals. In particular, large signal performance in PDSOI switches is affected by charge accumulation in a quasi-neutral region of the body of the PDSOI transistors. Charge accumulation may result in hot-carrier accumulation, excess gate-induced drain leakage (GIDL), negative transconductance, loss of gate control, hysteresis, etc. These issues may be generally referred to as floating body effect (FBE).

In an n-channel metal oxide semiconductor field effect transistor (NMOS) device, the most common way to suppress hot-carrier accumulation related to FBE is to create a discharge path for the accumulated charges. A negative DC voltage is applied to the gate of the NMOS in order to turn it off while the body is kept floating. Therefore, in order to bleed the accumulated charges and turn off the parasitic bipolar junction transistor (BJT) that forms across the NMOS, the negative DC voltage needs to be transmitted to the body.

Several techniques were developed to perform this task. These techniques include connecting the body to the gate using diodes or diode-connected FETs, or even applying a negative DC voltage equal to the gate voltage using a large resistor (referred to as "resistive body contact"). While these techniques may bleed the hot-charges, turn off the parasitic BJT, and help suppress harmonics generated by the off FETs; they may also adversely affect operation of the device in other ways.

For example, the diode-connected FET may transmit the negative DC voltage applied to the gate plus a DC threshold voltage, Vth, which corresponds to the device threshold voltage. This may compromise efficiency of the charge-bleeding mechanism.

For another example, the resistive body contact may be able to apply the appropriate negative DC voltage to the body of the device; however, the resistor may be associated with extra insertion loss and decreased performance with respect to intermodulation distortion (IMD) and second-order harmonics.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "NB" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

Figure 1:
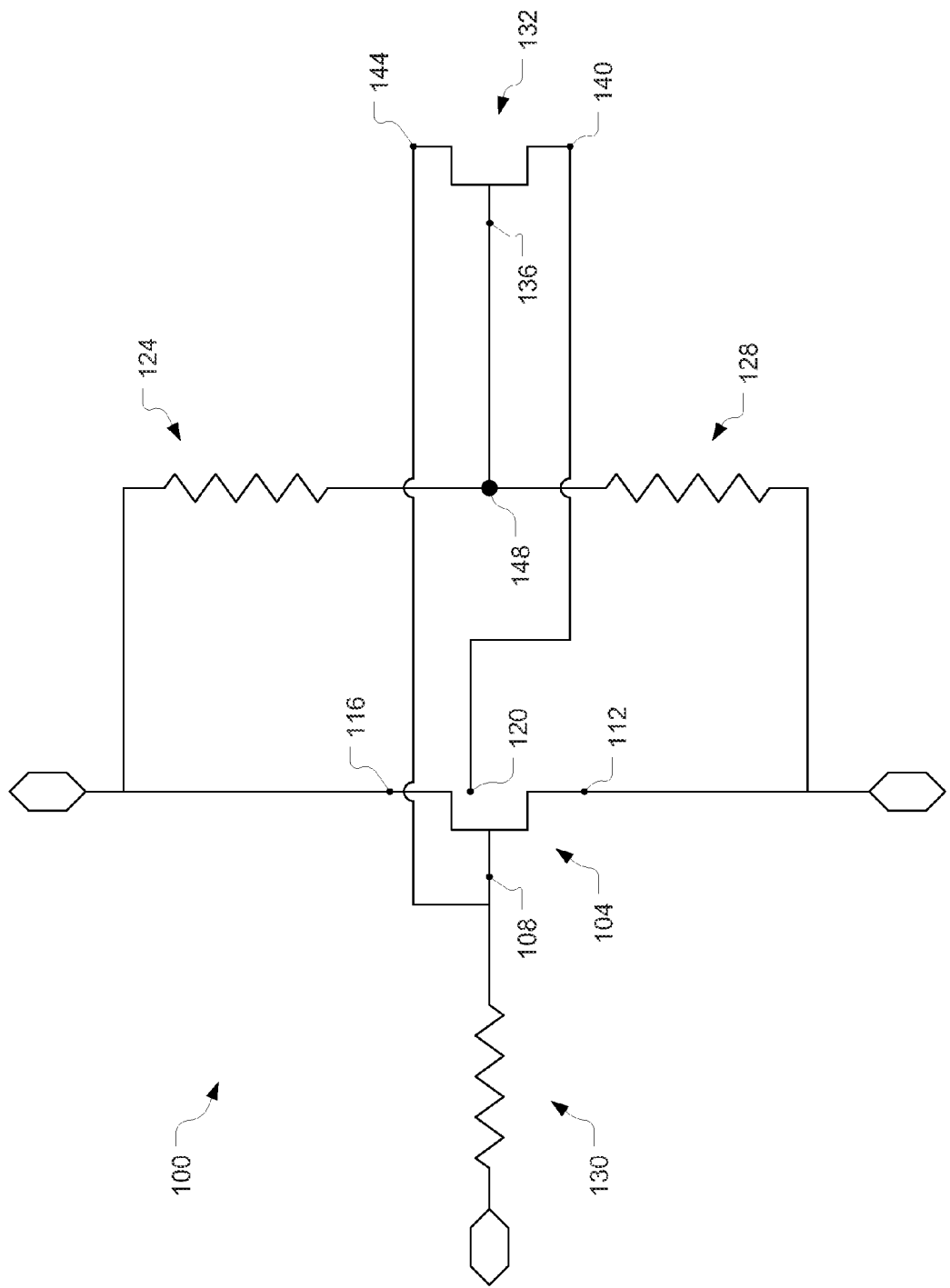
FIG. 1 illustrates a switch circuit in accordance with various embodiments.

FIG. 1 illustrates a switch circuit 100 in accordance with various embodiments. Switch circuit 100 may be a silicon on insulator (SOI) device having a silicon layer disposed on an insulating layer, which may also be referred to as a buried oxide (BOX) layer. In some embodiments an additional silicon layer may be disposed under the insulating layer.

In various embodiments, the top silicon layer may be approximately 50-90 nanometers (nm) thick and the insulating layer, which may be a silicon dioxide or sapphire layer, may be approximately 100 to 200 nm thick. In some embodiments, the switch circuit 100 may be a partially-depleted SOI (PDSOI) device in which the silicon under a doped channel is partially depleted of mobile charge carriers. The partially depleted area may be referred to as a quasi-neutral region.

Switch circuit 100 may include a switch transistor 104. In embodiments in which the switch circuit 100 is a PDSOI, the switch transistor 104 may have a tendency to accumulate charges in the quasi-neutral region. Embodiments described herein provide for the discharge of these accumulated charges while mitigating at least some of the above-identified issues related to other techniques devised to address the FBE issues.

The switch transistor 104 may include a gate contact 108, a source contact 112, a drain contact 116, and a body contact 120. The switch circuit 100 may further include resistors 124 and 128 coupled in series with one another and further coupled with and between the source contact 112 and the drain contact 116 as shown. The resistors 124 and 128 may be of equal size in some embodiments. The switch circuit 100 may further include resistor 130 coupled with gate contact 108.

While the switch transistor 104 is generally shown as an NMOS in FIG. 1, the switch transistor 104 may be a PMOS in other embodiments.

The switch circuit 100 may further include a discharge transistor 132. The discharge transistor 132 may work to create a discharge path to discharge charges that accumulate in the quasi-neutral region of the switch transistor 104. The discharge transistor 132 may include a gate contact 136, a source contact 140, and a drain contact 144. The gate contact 136 may be coupled with a node 148 that is located between resistors 124 and 128; the source contact 140 may be coupled with the body contact 120; and the drain contact 144 may be coupled with the gate contact 108.

The resistors 124 and 128 may provide a virtual ground, e.g., a fixed potential, at the node 148 and, therefore, the gate contact 136. Using the discharge transistor 132 to tie the body contact 120, the drain contact 116, and the source contact 112 to the fixed potential of the node 148 may facilitate removal of the potential difference between the gate contact 108 and the body contact 120 and, therefore, discharging charges from the quasi-neutral region.

Figure 2:
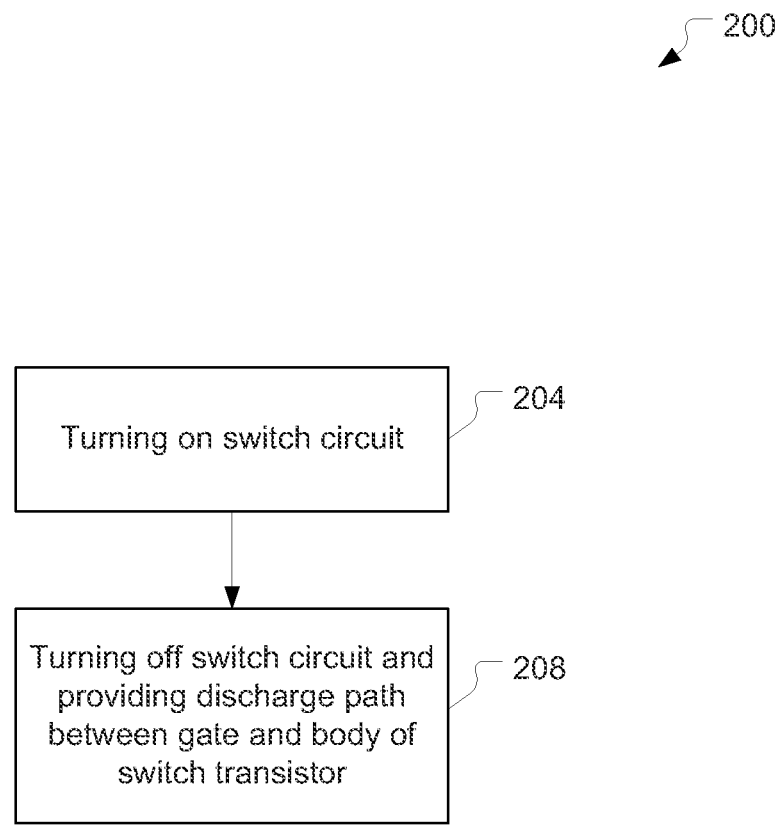
FIG. 2 illustrates a flowchart of a switching operation in accordance with various embodiments.

FIG. 2 shows a flowchart of a switching operation 200 in accordance with various embodiments. The switching operation 200 may be performed by a switch circuit, e.g., switch circuit 100, in accordance with some embodiments.

At block 204, the switching operation 200 may include turning on the switch circuit. In some embodiments, the switch circuit may be turned on by turning on the switch transistor, e.g., switch transistor 104, to pass a signal, e.g., a radio frequency (RF) signal, between source and drain contacts.

In some embodiments, the switch transistor may be turned on by application of a positive DC voltage, e.g., 2.5 volts (V), to the gate contact of the switch transistor. The drain contact of the discharge transistor, e.g., drain contact 144, will also see the positive DC voltage. The gate contact of the discharge transistor, e.g., gate contact 136, may see a 0 voltage at the virtual ground. This may result in a gate-source voltage, V_gs, of −2.5 V at the discharge transistor. This will turn off the discharge transistor and, in effect, remove the discharge transistor from the switch circuit.

At block 208, the switching operation 200 may include turning off the switch circuit and providing a discharge path between gate and body of the switch transistor. In some embodiments, the switch circuit may be turned off by turning off the switch transistor to prevent passage of a signal, e.g., the RF signal. In some embodiments, the switch transistor may be turned off by application of a negative DC voltage, e.g., −2.5 V, to the gate contact of the switch transistor. The drain contact of the discharge transistor will also see the negative DC voltage. This will result in a V_gs of 2.5 V at the discharge transistor. This will turn on the discharge transistor 132 thereby creating a discharge path by coupling the gate contact of the switch transistor to the body contact of the switch transistor. This may be done without having to provide voltage headroom as there will be no Vth drop.

While switching operation 200 is generally discussed in terms of using an NMOS transistor as the switch transistor (also referred to as "NMOS switch"), switching operations applicable to embodiments using a PMOS transistor as the switch circuit (also referred to as "PMOS switch") may be used. In various embodiments, the NMOS transistor may be used as the discharge transistor in a switch circuit that is to transmit a negative DC voltage to the body of the switch transistor, while a PMOS transistor may be used in a switch circuit that is to transmit a positive DC voltage to the body of the switch transistor.

Providing a discharge path using the switch circuit 100 as described above does not incur the same penalty related to voltage threshold headroom that is associated with a diode-connected FET switch circuit. Example simulations have shown that, with respect to a diode-connected FET switch circuit, the switch circuit 100 may be associated with a 3 dB improvement with respect to IMD, a 2.5 dB improvement with respect to third-order harmonics, and a 1.5 dB improvement with respect to second-order harmonics.

Providing a discharge path using the switch circuit 100 as described above also does not incur the same penalty related to insertion loss that is associated with a resistive body contact (BC) switch circuit. Example simulations have shown that, with respect to a resistive BC switch circuit, the switch circuit 100 may be associated with 40 millidecibles (mdB) or greater improvement with respect to insertion loss, 1 dB improvement with respect to IMD, a 3.5 dB improvement with respect to second-order harmonics, and a 0.5 dB improvement with respect to third-order harmonics.

The switch circuit 100 may be a common-gate amplifier and may be incorporated into a large number of applications including, but not limited to, complementary metal oxide semiconductor (CMOS) switches, power amplifiers, low-noise amplifiers (LNAs), buffers, duplexers, etc.

Figure 3:
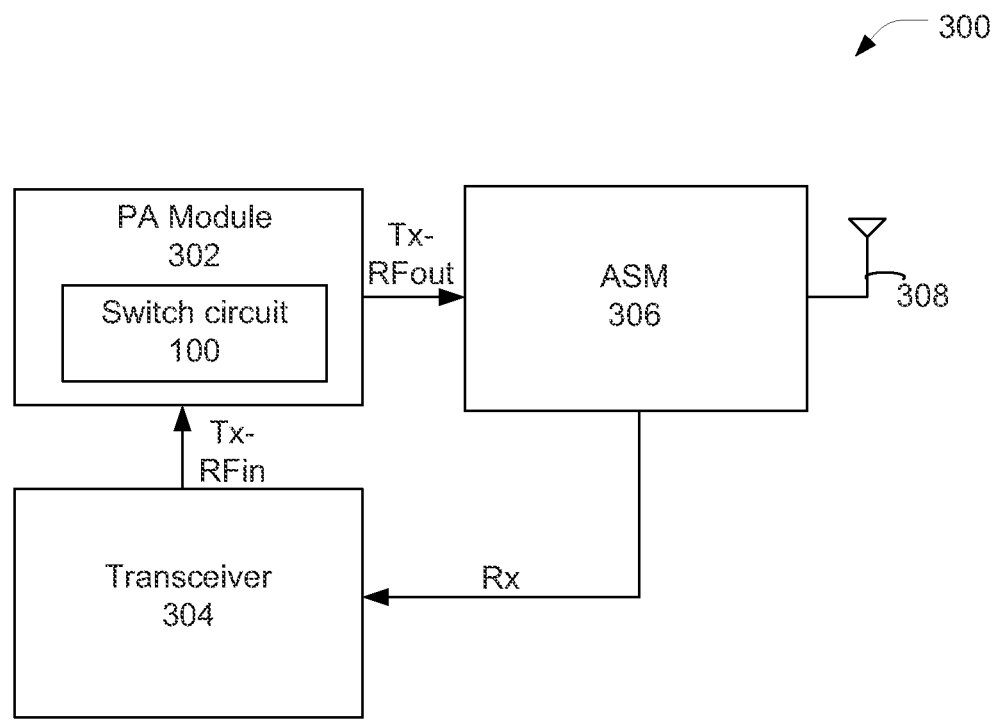
FIG. 3 is a block diagram of an exemplary wireless communication device in accordance with various embodiments.

The switch circuit 100 may be incorporated into a variety of systems. A block diagram of an example system 300 is illustrated in FIG. 3. As illustrated, the system 300 includes a power amplifier (PA) module 302, which may be a radio frequency (RF) PA module in some embodiments. The system 300 may include a transceiver 304 coupled with the PA module 302 as illustrated. The PA module 302 may include the switch circuit 100 to perform any of a variety of operations such as amplification, switching, mixing, etc. In various embodiments, a switch circuit (e.g., switch circuit 100) may additionally/alternatively be included in the transceiver 304 to provide, e.g., up-converting, or in an antenna switch module (ASM) 306 to provide various switching functions.

The PA module 302 may receive an RF input signal, RFin, from the transceiver 304. The PA module 302 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 3.

The amplified RF output signal, RFout, may be provided to the ASM 306, which effectuates an over-the-air (OTA) transmission of the RF output signal, RFout, via an antenna structure 308. The ASM 306 may also receive RF signals via the antenna structure 308 and couple the received RF signals, Rx, to the transceiver 304 along a receive chain.

In various embodiments, the antenna structure 308 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 300 may be any system including power amplification. In various embodiments, inclusion of switch circuit 100 in the system 300 to switch the RF signal may be particularly useful when the system 300 is used for power amplification at high RF power and frequency. For example, including the switch circuit 100 into the system 300 may be especially beneficial for transmission of Global System for Mobile Communication (GSM) signals with a power approximately 32 dBm or greater and a frequency of approximately 1800 megahertz (MHz) or higher, as well as lower band GSM signals, e.g., 800 MHz-915 MHz, having a power of approximately 34 dBm or greater.

The system 300 may be suitable for any one or more of terrestrial and satellite communications, radar systems, and possibly in various industrial and medical applications. More specifically, in various embodiments, the system 300 may be a selected one of a radar device, a satellite communication device, a mobile computing device (e.g., a phone, a tablet, a laptop, etc.), a base station, a broadcast radio, or a television amplifier system.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit comprising:
    a switch transistor having gate, source, drain, and body contacts;
    first and second resistors coupled in series with one another and further coupled with and between the source and drain contacts; and
    a discharge transistor having a first contact coupled with the body contact of the switch transistor, a second contact coupled with the gate contact of the switch transistor, and a gate contact coupled with the first and second resistors.

2. The circuit of claim 1, wherein the gate contact is coupled with a first node between the first and second resistors.

3. The circuit of claim 1, wherein the first node is a virtual ground.

4. The circuit of claim 1, wherein the circuit is a silicon on insulator (SOI) device.

5. The circuit of claim 4, wherein the SOI device comprises a partially depleted SOI device.

6. The circuit of claim 1, wherein the circuit is an n-channel metal oxide semiconductor field effect transistor (NMOS) switch configured to transmit a negative DC voltage.

7. The circuit of claim 1, wherein the circuit is a p-channel metal oxide semiconductor field effect transistor (PMOS) switch configured to transmit a positive DC voltage.

8. The circuit of claim 1, wherein the first resistor and the second resistor are of equal size.

9. The circuit of claim 1, wherein the first contact of the discharge transistor is a source contact of the discharge transistor and the second contact of the discharge transistor is a drain contact of the discharge transistor.

10. The circuit of claim 1, wherein the circuit comprises a common-gate amplifier.

11. A partially-depleted silicon on insulator (PDSOI) device comprising:
    a first transistor configured to pass a signal when turned on and to prevent passage of the signal when turned off;
    a node configured to provide a virtual ground; and
    a second transistor having a first contact coupled with the node and a second contact coupled with a body of the first transistor to provide a discharge path to the body when the first transistor is turned off.

12. The PDSOI device of claim 11, wherein the first contact is a gate contact and the second contact is a source contact.

13. The PDSOI device of claim 11, further comprising:
    a first resistor and a second resistor coupled in series with one another,
    wherein the node is disposed between the first and second resistors.

14. The PDSOI device of claim 11, wherein the first transistor comprises a source contact coupled with the first resistor and a drain contact coupled with the second resistor.

15. The PDSOI device of claim 11, wherein the second transistor is configured to be turned off when the first transistor is turned on.

16. The PDSOI device of claim 15, wherein the second transistor is further configured to be turned on when the first transistor is turned off.

17. A system comprising:
    a transceiver configured to provide a signal;
    a power amplification module configured to receive the signal from the transceiver and amplify the signal for transmission; and
    a switch circuit, disposed in the transceiver or in the PA module, the switch circuit including a partially-depleted, silicon on insulator (PDSOI) device having:
    a switch transistor configured to switch the signal;
    a pair of resistors configured to provide a virtual ground at a first node; and
    a discharge transistor coupled with the switch transistor and the first node and configured to provide a discharge path to discharge charges in a body of the switch transistor.

18. The system of claim 17, wherein the discharge transistor is configured to provide the discharge path when the switch transistor is turned off.

19. The system of claim 17, wherein the signal is to be transmitted with a power of 32 dBM or greater and having a frequency of 1800 megahertz or higher.

20. The system of claim 17, wherein the signal is to be transmitted with a power of 34 dBM or greater and having a frequency within 800-915 megahertz.

* * * * *